(12) United States Patent
Kim

(10) Patent No.: US 7,449,751 B2
(45) Date of Patent: Nov. 11, 2008

(54) HIGH VOLTAGE OPERATING ELECTROSTATIC DISCHARGE PROTECTION DEVICE

(75) Inventor: Kil-Ho Kim, Chungcheongbuk-do (KR)

(73) Assignee: Magnachip Semiconductor, Ltd. (KR)

( * ) Notice: Subject to any disclaimer, the term of this patent is extended or adjusted under 35 U.S.C. 154(b) by 134 days.

(21) Appl. No.: 11/222,372

(22) Filed: Sep. 7, 2005

(65) Prior Publication Data

US 2006/0049463 A1    Mar. 9, 2006

(30) Foreign Application Priority Data

Sep. 8, 2004  (KR)  ............. 10-2004-0071802

(51) Int. Cl.
*H01L 23/62* (2006.01)
(52) U.S. Cl. .............. 257/355; 257/356; 257/357; 257/360; 257/546; 257/E29.014
(58) Field of Classification Search ......... 257/355–357, 257/360, 546, E29.008, E29.012, E29.013
See application file for complete search history.

(56) References Cited

U.S. PATENT DOCUMENTS

2002/0056877 A1*  5/2002  Liu et al. ............. 257/355

* cited by examiner

*Primary Examiner*—Matthew E Warren
(74) *Attorney, Agent, or Firm*—Blakely, Sokoloff, Taylor & Zafman

(57) ABSTRACT

A high voltage operating electrostatic discharge protection device is provided. The high voltage operating electrostatic discharge protection device includes: a first gate structure and a second gate structure disposed on a substrate of a first conductive type with a predetermined distance; a well of the first conductive type formed in a first region of the substrate such that the well contacts one bottom portion of the first gate structure; a source region of a second conductive type formed within in the well; a counter pocket source region of the first conductive type formed within the well encompassing the source region; and a drift region of the second conductive type contacting a bottom surface of the second gate structure and formed in a second region of the substrate such that the drift region contacts the other bottom portion of the first gate structure.

13 Claims, 6 Drawing Sheets

HIGH VOLTAGE OPERATING ELECTROSTATIC DISCHARGE PROTECTION DEVICE

FIELD OF THE INVENTION

The present invention relates to a high voltage device in a semiconductor device; and more particularly, to a high voltage operating electrostatic discharge protection device.

DESCRIPTION OF RELATED ARTS

Generally, an electrostatic discharge (ESD) event is one important influential factor for determining reliability of semiconductor chips. The ESD event can occur during processing semiconductor chips or installing semiconductor chips on a system and often causes damage to the semiconductor chips. Therefore, electrostatic discharge protection devices are often required.

As for static electricity generated at a semiconductor device, when a semiconductor integrated circuit is in contact with a person who carries an electric charge or electric equipment, static electricity charged by the person or electric equipment passes through input/output pads via outer pins of the semiconductor integrated circuit and becomes discharged inside the semiconductor device, thereby generating excessive electrostatic current waves in high energy, which may cause severe damage to internal circuits of the semiconductor device. Especially, an electrostatic model charged by human bodies is called a human body model and an electrostatic model charged by equipment is called a machine model.

Meanwhile, static electricity generated inside the semiconductor device may damage internal circuits of the semiconductor device as a high level of electrostatic currents flows from the inner side of the semiconductor device into the equipment as the semiconductor device makes a contact with the equipment. This electrostatic model is called a charge device model.

Most semiconductor devices have an ESD protection device between an individual input/output pad and an internal circuit to protect main internal circuits against damage caused by the static electricity.

High voltage operating transistors usually include highly doped source/drain regions and lowly doped regions (e.g., drift regions) to improve the avalanche breakdown voltage.

FIG. 1 is a graph showing characteristics of a conventional ESD protection device in a semiconductor device.

As shown, the ESD protection device should not operate when a normal operation voltage Vop is supplied to the ESD protection device. That is, an avalanche breakdown voltage Vav level and a turn-on voltage Vtr level of the ESD protection device should be greater than the operation voltage Vop level. If a voltage level that is lower than the avalanche breakdown voltage Vav level is supplied, leakage current should be in a sufficient low level.

During the operation of the ESD protection device, gate insulation layers of transistors configuring the ESD protection device and a peripheral circuit should not be damaged. Thus, the turn-on voltage Vtr level and a thermal breakdown voltage Vtb level should be lower than a gate oxide breakdown voltage Vgox level.

Also, the ESD protection device should not operate abnormally by a latch-up event. Hence, the ESD protection device should have a wide range of safety margin ΔV over the operation voltage Vop, and a snapback holding voltage Vh level should be higher than the operation voltage Vop level (i.e., Vop+ΔV<Vh) or a turn-on current Itr should be in a sufficiently high level. More specifically, the turn-on current Itr level is greater than 100 mA.

The ESD protection device should be resistant to current generated by ESD stress. That is, the ESD protection device should be capable of handling a large amount of electrostatic current by having a sufficiently high level of the thermal breakdown voltage Vtb, i.e., thermal breakdown current (Itb).

If the ESD device is formed in a multi-finger structure, each finger should perform consistently. Before a specific finger of the multi-finger structure reaches a certain thermal breakdown voltage Vtb level as the specific finger is turned on, other fingers need to be turned on to discharge electrostatic current. For this effect, the thermal breakdown voltage Vtb should be larger than or at least equal to the turn-on voltage Vtr.

The ESD protection device needs to be operated at a shaded region in FIG. 1 to satisfy the above described characteristics of the ESD protection device.

FIG. 2 is a cross-sectional view showing a conventional high voltage operating ESD protection device. Particularly, FIG. 2 shows a typical ESD protection device implemented in a semiconductor device operated at a high voltage level and the illustrated ESD protection device has an N-type silicon controlled rectifier with a P-channel metal-oxide semiconductor (PMOS) pass (hereinafter referred to as an NSCR_PPS) structure.

With reference to FIG. 2, a method for fabricating the conventional ESD protection device will be described in detail.

First, a P-type well 11 is formed in a P-type substrate 12 through an ion implantation process using high energy. Inside the P-type well 11, active regions including a P-type well pick-up region 3, an N-type source region 4, an N-type active region 6, a P-type source region 7, a P-type drain region 8, and an N-type drain region 9 are formed. An N-type drift region 5 is formed inside the P-type well 11 such that the N-type drift region 5 encompasses the N-type active region 6, the P-type source region 7, the P-type drain region 8, and the N-type drain region 9.

A first gate structure 1 is formed on a portion of the P-type substrate 12 disposed between the N-type source region 4 and the N-type drift region 5. The N-type source region 4 is disposed close to the first gate pattern 1, and the N-type drift region 5 is disposed close to the first gate structure 1 or is overlapped with the first gate structure 1. A second gate structure 2 is formed on another portion of the P-type substrate 12 disposed between the P-type source region 7 and the P-type drain region 8. The P-type source region 7 and the P-type drain region 8 are disposed close to the second gate structure 2. The above described arrangement provides a PMOS pass structure through combining the P-type source region 7, the P-type drain region 8 and the second gate structure 2.

As shown in FIG. 2, between those active regions such as the P-type well pick-up region 3, the N-type source region 4, the N-type active region 6, the P-type source region 7, the P-type drain region 8, and the N-type drain region 9, groups of a device isolation layer 13 and an N-type field-stop region 10 are formed to give an electric isolation.

The P-type well pick-up region 3, the N-type source region 4, the first gate structure 1 are electrically connected with a first electrode ELECTRODE-1. The P-type drain region 8 and the N-type drain region 9 are connected with a second electrode ELECTRODE-2.

Hereinafter, the operation of the high voltage operating ESD protection device will be described in detail.

When an electrostatic signal is inputted between the first electrode ELECTRODE-1 set in a ground voltage and the second electrode ELECTRODE-2 set in a positive voltage, a lateral NPN bipolar transistor including the N-type source region 4, the P-type well 11 and the N-type drift region 5 and a vertical PNP transistor including the P-type drain region 8, the N-type drift region 5 and the P-type well 11 operate to discharge the electrostatic signal.

The avalanche breakdown voltage of the NPN bipolar transistor is determined by a breakdown voltage of a parallel junction between the N-type drift region 5 and the P-type well 11, while the avalanche breakdown voltage of the PNP bipolar transistor is determined by a breakdown voltage of a vertical junction between the N-type drift region 5 and the P-type well 11. In general, the breakdown voltage of the parallel junction is lower than that of the vertical junction.

Therefore, when the electrostatic signal is generated, if the first electrode is in a ground state and the second electrode is in a high voltage state.(e.g., a positive voltage value), the avalanche breakdown voltage of the NPN bipolar transistor having the parallel junction determines a turn-on voltage in the case that the ESD protection device is formed in an NSCR_PPS structure.

Meanwhile, when the electrostatic signal is generated, if the first electrode is in a high voltage state (e.g., a positive voltage value) and the second electrode is in a ground voltage state, the P-type well 11 and the N-type drift region 5 function as a diode. Especially, the electrostatic signal causes the diode to function as the forward biased diode, thereby resulting in a discharge of the electrostatic signal.

FIGS. 3A and 3B are graphs showing operation characteristics of the conventional ESD protection device illustrated in FIG. 2. Especially, FIG. 3A is a graph showing an enlarged view of a certain portion of FIG. 3B. With reference to FIGS. 3A and 3B, several disadvantages of the conventional ESD protection device will be reviewed.

In the conventional ESD protection device, e.g., the NSCR_PSS type ESD protection device, at the moment that avalanche breakdown and turn-on events occur, electrostatic current is concentrated at the surface of the NSCR_PSS type ESD protection device since only a parasitic NPN bipolar transistor operates. Hence, a path where the main current flows has a high on-state resistance level. As a result, a certain high voltage is applied between the first electrode ELECTRODE-1 and the second electrode ELECTRODE-2. A reference point 'A' in FIG. 3A illustrates the above described state.

However, as the electrostatic current flowing into the ESD protection device increases, the parasitic PNP bipolar transistor operates and the electrostatic current flows not only into the surface of the ESD protection device but also into deep regions of the ESD protection device. Such a wide distribution of the electrostatic current causes the main current path to have a low on-state resistance level on average, and thus, a very low voltage is applied between the first electrode ELECTRODE-1 and the second electrode ELECTRODE-2. A reference point B in each of FIGS. 3A and 3B expresses this very low voltage level state.

Even if the electrostatic current increases in response to the electrostatic signal, such conditions of the wide electrostatic current distribution and the low on-state resistance level are maintained before a thermal breakdown voltage is reached if the electrostatic current is widely distributed to those deep regions of the ESD protection device. Hence, as illustrated in a reference point C of FIG. 3B, a very low voltage is applied between the first electrode ELECTRODE-1 and the second electrode ELECTRODE-2.

It should be noted that FIGS. 3A and 3B show graphs obtained after a current-voltage characteristic is simulated under a specific condition that the electrostatic current inflows in response to the electrostatic signal at the ESD protection device.

In more detail of the above simulation result on the current-voltage characteristic of the conventional ESD protection device, a snapback holding voltage Vh was lower than an operation voltage Vop; a thermal breakdown voltage Vtb was lower than the operation voltage Vop; and the thermal breakdown voltage Vtb was lower than a triggering voltage Vtr, i.e., a turn-on voltage.

If the snapback holding voltage Vh is lower than the operation voltage Vop, there may be a high risk of a latch-up event, which may result in a malfunction or dysfunction of the ESD protection device. Also, as shown in the simulation result, since the thermal breakdown voltage Vtb was lower than the turn-on voltage Vtr, individual fingers of a multi-finger structure may not operate consistently. Accordingly, these mentioned disadvantages should be improved to realize a stable electrostatic protection function of the ESD protection device.

SUMMARY OF THE INVENTION

It is, therefore, an object of the present invention to provide a high voltage operating electrostatic discharge (ESD) protection device, wherein the high voltage operating ESD protection device can be operated stably by maintaining a snapback holding voltage to be higher than an operation voltage and by causing a thermal breakdown voltage to be greater than a turn-on voltage.

In accordance with an aspect of the present invention, there is provided a high voltage operating electrostatic discharge protection device, including: a first gate structure and a second gate structure disposed on a substrate of a first conductive type with a predetermined distance; a well of the first conductive type formed in a first region of the substrate such that the well contacts one bottom portion of the first gate structure; a source region of a second conductive type formed within in the well; a counter pocket source region of the first conductive type formed within the well encompassing the source region; and a drift region of the second conductive type contacting a bottom surface of the second gate structure and formed in a second region of the substrate such that the drift region contacts the other bottom portion of the first gate structure.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A high voltage operating electrostatic discharge protection device in accordance with certain embodiments of the present invention will be described in detail with reference to the accompanying drawings.

Figure 1:
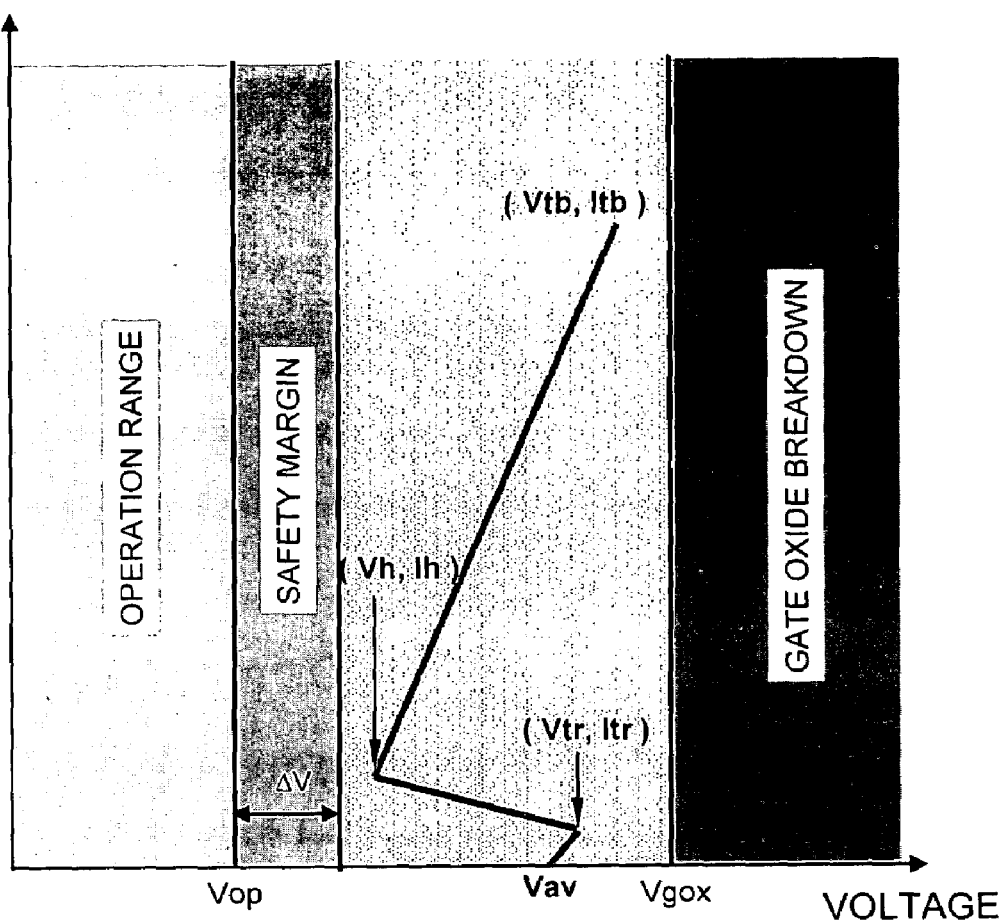
FIG. 1 is a graph showing characteristics of a conventional electrostatic discharge (ESD) protection device in a semiconductor device.
Figure 2:
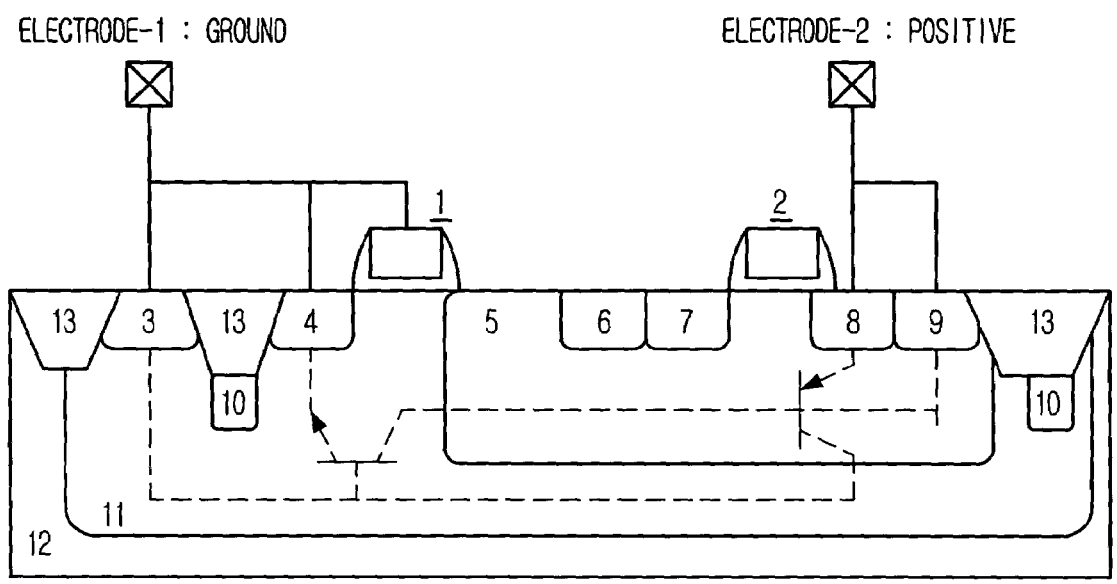
FIG. 2 is a cross-sectional view showing a conventional high voltage operating ESD protection device.
Figure 3A:
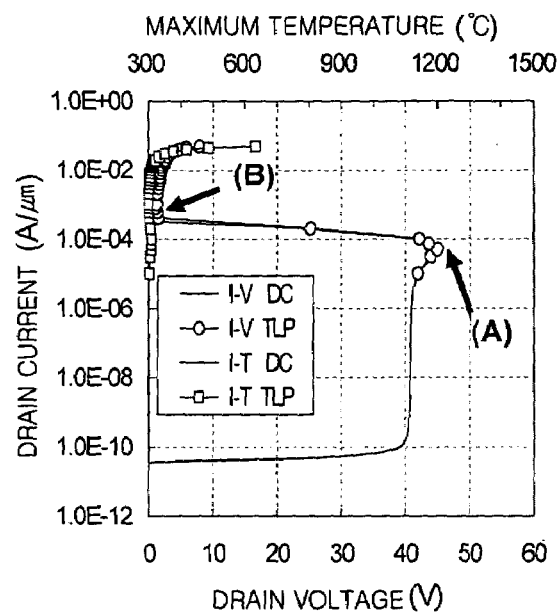
FIGS. 3A and 3B are graphs showing operation characteristics of the conventional high voltage operating ESD protection device illustrated in FIG. 2.
Figure 3B:
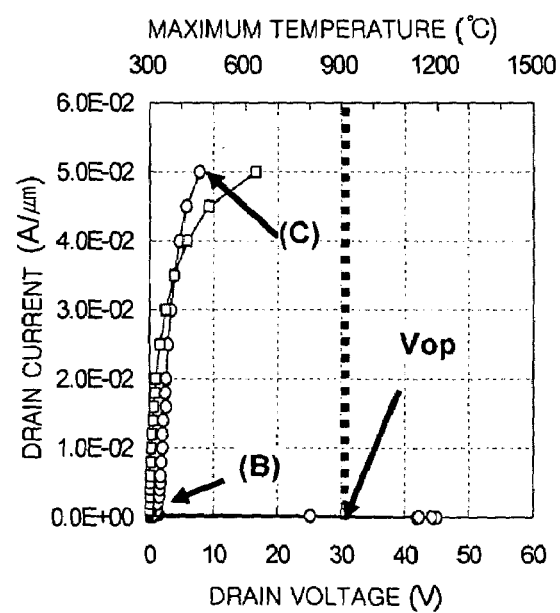
Figure 4:
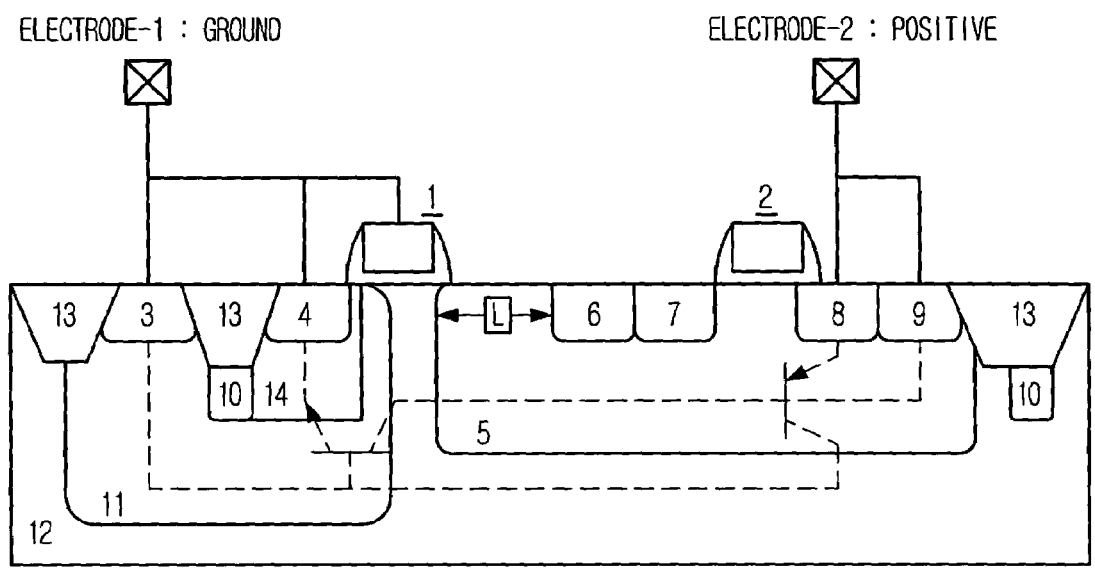
FIG. 4 is a cross-sectional view showing a high voltage operating ESD protection device in accordance with a specific embodiment of the present invention.

FIG. 4 is a cross-sectional view showing a high voltage operating electrostatic discharge (ESD) protection device in accordance with a first embodiment of the present invention.

The high voltage operating ESD protection device proposed by the first embodiment is an N-type silicon controlled rectifier with a P-channel metal-oxide semiconductor pass structure and a counter pocket source structure (hereinafter referred to as NSCR_PPS_CPS). It should be noted that the same reference numerals are used for the same elements even in different drawings and detailed description of such elements will be omitted.

As shown, the high voltage operating ESD protection device is configured in an NSCR_PPS structure. However, an area of a P-type well 11 formed through an ion implantation process using high energy is reduced so that one edge of the P-type well 11 is partially overlapped with a region where a first gate structure 1 is formed. That is, the P-type well 11 is formed not to be overlapped with an N-type drift region 5, so that those active regions including the N-type drift region 5 and an N-type active region 6, a P-type source region 7, a P-type drain region 8, and an N-type drain region 9, which are formed inside the N-type drift region 5, are exposed to a P-type substrate 12. As a result of this exposure of the active regions, the high voltage operating ESD protection device is configured in an NSCR_PPS_CPS structure.

A counter pocket source region 14 is formed with a certain overlap margin with respect to an N-type source region 4. More specifically, an impurity having an opposite polarity to the N-type source region 4, i.e., a P-type impurity, is implanted to form a P-type counter pocket source region 14 encompassing the N-type source region 4.

As for concentrations of impurities for forming various elements, a P-type well pick-up region 3, the N-type source region 4, the N-type active region 6, the P-type source region 7, and the N-type drain region 9 individually has a concentration of approximately $10^{15}$ cm$^{-3}$ to approximately $10^{16}$ cm$^{-3}$. The N-type drift region 5 has a concentration of approximately $10^{13}$ cm$^{-3}$; the P-type N-type filed-stop region 10 has a concentration of approximately $10^{12}$ cm$^{-3}$ to approximately $10^{13}$ cm$^{-3}$; the P-type well 11 has a concentration of approximately $10^{12}$ cm$^{-3}$; the P-type counter pocket source region 14 has a concentration of approximately $10^{13}$ cm$^{-3}$ to approximately $10^{14}$ cm$^{-3}$; and the P-type substrate 12 has a concentration of approximately $10^{11}$ cm$^{-3}$. Therefore, the impurity concentration of the P-type counter pocket source region 14 is lower than that of the N-type source region 4 but higher than the N-type drift region 5.

Hereinafter, operation of the high voltage operating ESD protection device with the NSCR_PPS_CSP structure will be described in detail.

Upon a generation of an electrostatic signal, a ground voltage is supplied to a first electrode ELECTRODE-1, while a positive voltage is supplied to a second electrode ELECTRODE-2. Then, a lateral NPN bipolar transistor including the N-type source region 4, the P-type well 11 and the N-type drift region 5 and a vertical PNP bipolar transistor including the P-type drain region 8, the N-type drift region 5 and the P-type well 11 operate to discharge the electrostatic signal. A circuit obtained as the lateral NPN bipolar transistor is combined with the vertical PNP bipolar transistor is called a silicon controlled rectifier (SCR) circuit.

The avalanche breakdown voltage Vav of the lateral NPN bipolar transistor is determined by a breakdown voltage of a junction between the N-type drift region 5 and the P-type substrate 12, while that of the vertical PNP bipolar transistor is determined by a breakdown voltage of a junction between the N-type drift region 5 and the P-type substrate 12. Generally, the avalanche breakdown voltage of the lateral NPN bipolar transistor is lower than that of the vertical PNP bipolar transistor.

Therefore, the avalanche breakdown voltage Vav of the lateral NPN bipolar transistor determines a turn-on voltage of the ESD protection device with the NSCR_PPS structure, which operates when the first electrode ELECTRODE-1 and the second electrode ELECTRODE-2 are supplied with a ground voltage and a positive voltage, respectively in response to an electrostatic signal.

Generally, the breakdown voltage of the junction between the N-type drift region 5 and the P-type substrate 12 is often higher than that of a junction between the N-drift region 5 and the P-type well 11. Such an increase of the avalanche breakdown voltage can be compensated by decreasing a length between an edge of the N-type drift region 5 and an edge of the N-type active region 6.

In the case that the first electrode ELECTRODE-1 and the second electrode ELECTRODE-2 are supplied with a positive voltage and a ground voltage, respectively in response to an electrostatic signal, the P-type substrate 12 and the N-type drift region 5 function as a diode and, the electrostatic signal causes the diode to function as the forward biased diode, thereby resulting in a discharge of the electrostatic signal.

Figure 5A:
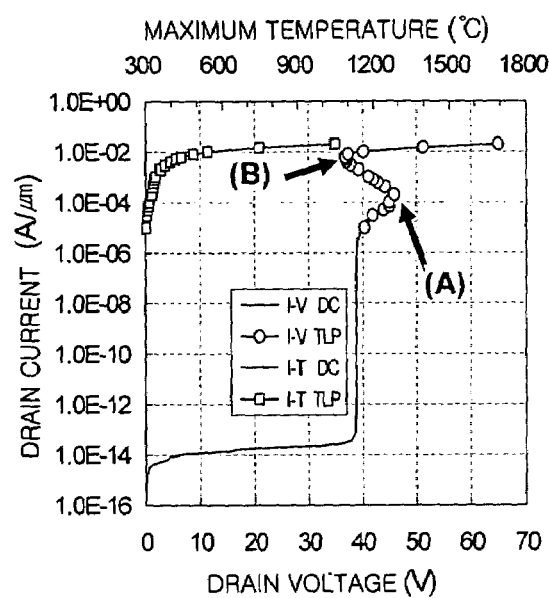
FIGS. 5A and 5B are graphs showing operation characteristics of the high voltage operating ESD protection device illustrated in FIG. 4.
Figure 5B:
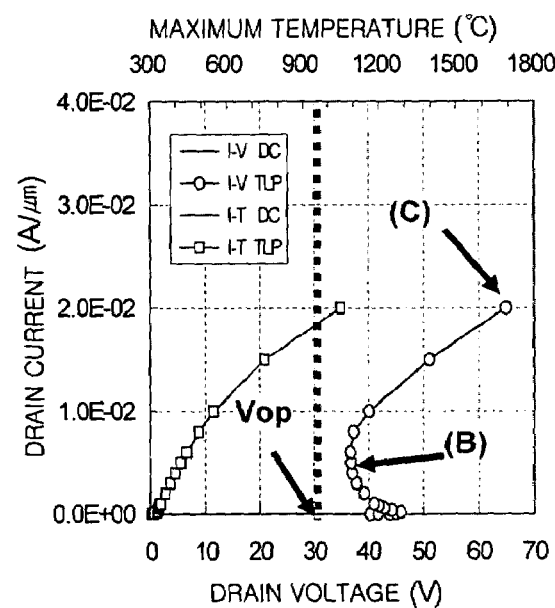

FIGS. 5A and 5B are graphs showing operation characteristics of the high voltage operating ESD protection device illustrated in FIG. 4. FIG. 5A is a graph showing an enlarged view of a certain portion of FIG. 5B. With reference to FIGS. 5A and 5B, operation of the high voltage operating ESD protection device will be described in detail.

As like the conventional ESD protection device with the NSCR_PPS structure, the ESD protection device with the NSCR_PPS_CPS structure has a parasitic NPN bipolar transistor operating at the moment that avalanche breakdown and turn-on events occur. Hence, large amounts of the electrostatic current flow via surface of the ESD protection device. As a result, a path where the main current flows due to the electrostatic signal has a high on-state resistance level on average, whereby a certain level of voltage is applied between the first electrode ELECTRODE-1 and the second electrode ELECTRODE-2. A reference point 'A' in FIG. 5A represents this described state.

As the electrostatic current increases due to the electrostatic signal inputted to the ESD protection device, a parasitic PNP bipolar transistor operates, and from this moment, the electrostatic current flows not only at the surface of the ESD protection device but also at inner deep regions of the ESD protection device. Even if the electrostatic current flows at the inner deep regions of the ESD protection device, the path where the main current flows in response to the electrostatic signal still has a high on-state resistance level on average due to the P-type well 11 narrower than a typically formed P-type well and the P-type counter pocket source region 14. Therefore, a certain level of voltage is applied between the first electrode ELECTRODE-1 and the second electrode ELECTRODE-2. A reference point 'B' in each of FIGS. 5A and 5B expresses this state.

Even if the electrostatic current increases, the on-state resistance level of the ESD protection device does not change in a certain extent, a voltage supplied between the first electrode ELECTRODE-1 and the second electrode ELECTRODE-2 increases in proportion to an amount of current flowing between the first electrode ELECTRODE-1 and the second electrode ELECTRODE-2. A reference point 'C' in FIG. 5B represents this described case.

The graphs shown in FIGS. 5A and 5B are obtained by simulating a current-voltage characteristic when the electrostatic current flows into the ESD protection device with the NSCR_PPS_CPS structure according to the first embodiment of the present invention. On the basis of the simulation result on the current-voltage characteristic, a snapback holding voltage Vh was higher than an operation voltage Vop and a thermal breakdown voltage Vtb was higher than a turn-on voltage Vtr.

Since the ESD protection device with the NSCR_PPS_CPS structure has the snapback holding voltage higher Vh than the operation voltage Vop, a latch-up event is less likely to occur. Also, since the thermal breakdown voltage Vtb is higher than the trun-on voltage Vtr, if the ESD protection device is configured in a multi-finger structure, individual fingers can operate stably. Accordingly, when the high voltage operating ESD protection device according to the first embodiment of the present invention is applied to semiconductor devices, it is possible to achieve more stable operation with respect to the electrostatic signal compared with the conventional ESD protection device.

Figure 6:
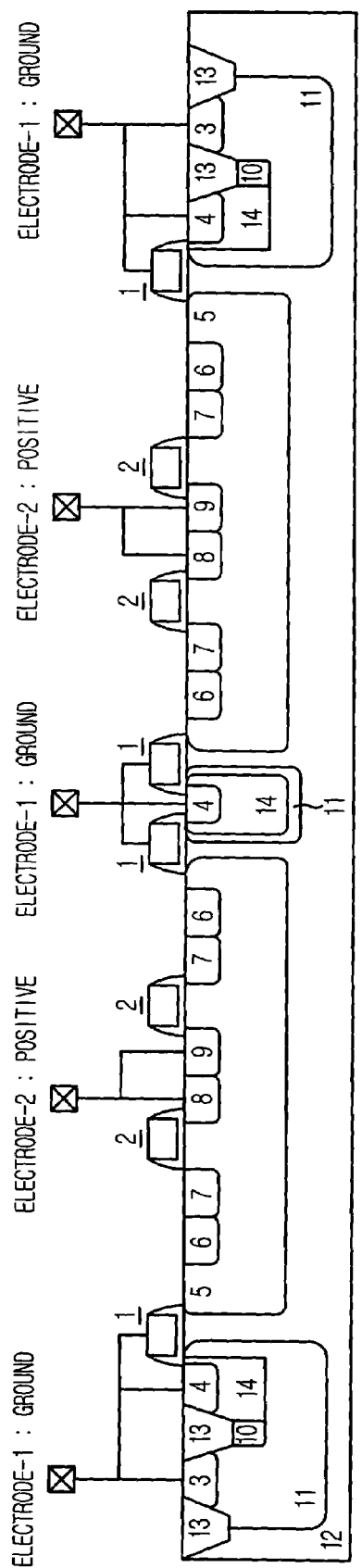
FIG. 6 is a cross-sectional view showing a high voltage operating ESD protection device in accordance with another specific embodiment of the present invention.

FIG. 6 is a cross-sectional view showing a high voltage operating ESD protection device in accordance with a second embodiment of the present invention. Especially, according to the second embodiment, the high voltage operating ESD protection device is configured in a NSCR_PPS_CPS structure and a multi-finger structure. It should be noted that detailed description of the same device elements described in FIG. 4 are omitted.

With respect to the P-type drain region 8 and the N-type drain region 9 connected to the second gate electrode ELECTRODE-2, the second gate structure 2, the P-type source 7, the N-type active region 6, the first gate structure 1, the N-type source region 4, the P-type counter pocket source region 14 are symmetrically arranged at a predetermined side of the substrate 12. That is, the high voltage operating ESD protection device in accordance with the second embodiment further includes a third gate structure, another P-type source region, and another N-type active region. The third gate structure is disposed on a portion of the substrate 12 within the N-type drift region 5 with a predetermined distance from the second gate structure and has one bottom portion contacting to the N-type drain region 9. The another P-type source region is disposed within the N-type drift region 5 and contacting the other bottom portion of the third gate structure. The another N-type active region is disposed within N-type drift region 5 and contacting the another P-type source region, thereby obtaining a substrate structure.

With respect to the first gate structure 1 and the N-type source region 4 both being connected with the first electrode ELECTRODE-1 and the P-type counter pocket source region 14 that are symmetrically arranged at the predetermined side of the substrate 12, the first gate structure 1, the N-type drift region 5, the N-type active region 6, the P-type source region 7, the second gate structure 2, the P-type drain region 8, and the N-type drain region 9 are symmetrically arranged at another predetermined side of the substrate 12. This symmetrical arrangement is repeated to increase the number of fingers in the multi-finger structure. That is, the high voltage operating ESD protection device in accordance with the second embodiment further includes another P-type well, a fourth gate structure, a fifth gate structure, another N-type source region; and another counter pocket source region. The another P-type well is disposed in a third region of the substrate 12 with a predetermined distance from the N-type drift region 5. The fourth gate structure has one bottom portion connected to N-type drift region 5 and the other bottom portion connected to the another P-type well. The fifth gate structure is disposed with a predetermined distance from the fourth gate structure and has one bottom portion connected to the another P-type well. The another N-type source region is disposed inside the another P-type well and connected to the other bottom portion of the fourth gate structure and the one bottom portion of the fifth gate structure. The another counter pocket source region is disposed inside the another P-type well and encompassing the another N-type source region. Herein, the substrate structure disposed at the one bottom portion of the fourth gate structure is symmetrically arranged at the other bottom portion of the fifth gate structure with respect to the another P-type well.

In accordance with the above described embodiments of the present invention, several effects are provided when the high voltage operating ESD protection device with the NSCR_PPS_CPS structure is applied to semiconductor devices.

First, a latch-up event is less likely to occur since a snapback holding voltage of the ESD protection device is higher than an operation voltage of the semiconductor device. Second, a thermal breakdown voltage is higher than a turn-on voltage of the ESD protection device. Therefore, in the case that the ESD protection device is configured in a multi-finger structure, individual fingers are allowed to operate consistently. Accordingly, the implementation of the ESD protection device to semiconductor devices makes it possible to stably protect internal circuits from static electricity. Despite that a thermal breakdown current level is lower than that of the conventional ESD protection device with the NSCR_PPS structure, the ESD protection device with the NSCR_PPS_CPS structure has an improved efficiency on stress current. As a result of these effects, it is further possible to fabricate semiconductor device with improved reliability.

The present application contains subject matter related to the Korean patent application No. 10-2004-0071802, filed in the Korean Patent Office on Sep. 8, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A high voltage operating electrostatic discharge protection device, comprising:
   a first gate structure and a second gate structure disposed on a substrate of a first conductivity type;
   a well of the first conductivity type formed in a first region of the substrate such that the well contacts one bottom portion of the first gate structure;
   a source region of a second conductivity type formed within in the well;
   a counter pocket source region of the first conductivity type formed within the well encompassing the source region; and
   a drift region of the second conductivity type contacting a bottom surface of the second gate structure and formed in a second region of the substrate such that the drift region contacts the other bottom portion of the first gate structure, wherein the well and the drift region do not overlap each other.

2. The high voltage operating electrostatic discharge protection device of claim 1, further including:

a source region of the first conductivity type formed inside the drift region and contacting one bottom portion of the second gate structure; and a drain region of the first conductivity type formed inside the drift region and contacting the other bottom portion of the second gate structure.

3. The high voltage operating electrostatic discharge protection device of claim 2, further including:

an active region of the second conductivity type formed inside the drift region and contacting the source region of the first conductivity type; and a drain region of the second conductivity type formed inside the drift region and contacting the drain region of the first conductivity type.

4. The high voltage operating electrostatic discharge protection device of claim 1, further including:

a well pick-up region of the first conductivity type disposed from the source region of the second conductivity type;

a first electrode connected with the first gate structure, the well pick-up region of the first conductivity type and the source region of the second conductivity type; and a second electrode connected with the drain region of the first conductivity type and the drain region of the second conductivity type.

5. The high voltage operating electrostatic discharge protection device of claim 1, wherein the first conductivity type includes a P-type impurity and the second conductivity type includes an N-type impurity.

6. The high voltage operating electrostatic discharge protection device of claim 1, wherein the counter pocket source region of the first conductivity type has an impurity concentration lower than that of the source region of the second conductivity type formed inside the well and higher than that of the drift region of the second conductivity type.

7. The high voltage operating electrostatic discharge protection device of claim 6, wherein the counter pocket source region has an impurity concentration ranging from approximately $10^{13}$ cm$^{-3}$ to approximately $10^{14}$ cm$_{-3}$.

8. The high voltage operating electrostatic discharge protection device of claim 7, wherein the source region of the second conductivity type formed inside the well has an impurity concentration ranging from approximately $10^{15}$ cm$^{-3}$ to approximately $10^{16}$ cm$^{-3}$.

9. The high voltage operating electrostatic discharge protection device of claim 3, wherein an avalanche breakdown voltage generated at a junction between the drift region and the substrate is compensated by removing a portion of the substrate between the active region of the second conductivity type and an edge portion of the drift region contacting the first gate structure when a breakdown voltage of the junction between N-type drift region and P-type substrate is higher than a breakdown voltage of a junction between N-drift region and P-type well.

10. The high voltage operating electrostatic discharge protection device of claim 3, further including:

a third gate structure disposed on a portion of the substrate within the drift region from the second gate structure and having one bottom portion contacting the drain region of the second conductivity type;

another source region of the first conductivity type disposed within the drift region and contacting the other bottom portion of the third gate structure; and another active region of the second conductivity type disposed within the drift region and contacting said another source region of the first conductivity type, thereby obtaining a substrate structure.

11. The high voltage operating electrostatic discharge protection device of claim 10, further including:

another well of the first conductivity type disposed in a third region of the substrate from the drift region;

a fourth gate structure having one bottom portion contacting the drift region and the other bottom portion contacting said another well;

a fifth gate structure disposed from the fourth gate structure and having one bottom portion contacting said another well;

another source region of the second conductivity type disposed inside said another well and contacting the other bottom portion of the fourth gate structure and said one bottom portion of the fifth gate structure; and another counter pocket source region of the first conductivity type disposed inside said another well and encompassing said another source region of the second conductivity type.

12. The high voltage operating electrostatic discharge protection device of claim 11, wherein the substrate structure disposed at said one bottom portion of the fourth gate structure is symmetrically arranged at the other bottom portion of the fifth gate structure with respect to said another well.

13. The high voltage operating electrostatic discharge protection device of claim 1, wherein the first region and the second region are formed in the shape of a trench.

* * * * *